US012632359B2

(12) United States Patent
Shukla et al.

(10) Patent No.: US 12,632,359 B2
(45) Date of Patent: May 19, 2026

(54) DETERMINING HEALTH OF A BLOCK OF A NON-VOLATILE MEMORY DEVICE BASED ON A DISTRIBUTION OF THRESHOLD VOLTAGES

(71) Applicant: Microchip Technology Incorporated, Chandler, AZ (US)

(72) Inventors: Pitamber Shukla, San Jose, CA (US); Chris Norrie, Castro Valley, CA (US); Igor Ziper, Sunnyvale, CA (US); Srinivas Yelisetti, Fremont, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 34 days.

(21) Appl. No.: 18/737,931

(22) Filed: Jun. 7, 2024

(65) Prior Publication Data

US 2025/0173236 A1 May 29, 2025

Related U.S. Application Data

(60) Provisional application No. 63/603,117, filed on Nov. 27, 2023.

(51) Int. Cl.
| | |
|---|---|
| *G06F 11/00* | (2006.01) |
| *G06F 11/30* | (2006.01) |
| *G06F 11/34* | (2006.01) |
| *G11C 16/34* | (2006.01) |

(52) U.S. Cl.
CPC ...... *G06F 11/3409* (2013.01); *G06F 11/3037* (2013.01); *G11C 16/3418* (2013.01); *G11C 16/3431* (2013.01)

(58) Field of Classification Search
CPC ............. G06F 11/3409; G06F 11/3037; G11C 16/3418; G11C 16/3431; G06N 20/00
See application file for complete search history.

(56) References Cited

U.S. PATENT DOCUMENTS

| | | | |
|---|---|---|---|
| 2016/0225460 A1* | 8/2016 | Chou ................... | G11C 29/021 |
| 2021/0232323 A1* | 7/2021 | Kannan ................ | G06F 3/0688 |
| 2021/0397510 A1* | 12/2021 | Liu .................... | G11C 16/0483 |

(Continued)

OTHER PUBLICATIONS

Written Opinion of the International Searching Authority for PCT/US2024/036771 (Year: 2025).*

(Continued)

*Primary Examiner* — Elmira Mehrmanesh
(74) *Attorney, Agent, or Firm* — Onyx IP Group

(57) ABSTRACT

In some implementations, a controller may perform, on one or more wordlines of a block of a non-volatile memory device, read operations using default threshold voltages associated with two overlapped charge states. The controller may determine, using a machine learning model, a distribution of threshold voltages for the two overlapped charge states based on read errors associated with the threshold voltages. The controller may determine, based on the determined distribution of threshold voltages, a health of the block. The controller may perform a block refresh operation for the block based on the health of the block. The block refresh operation may be performed when the health satisfies a health threshold. The block refresh operation may not be performed when the health does not satisfy the health threshold.

20 Claims, 13 Drawing Sheets

(56)            References Cited

U.S. PATENT DOCUMENTS

| 2022/0027083 | A1  |        | 1/2022 | Zuolo et al. |             |
|--------------|-----|--------|--------|--------------|-------------|
| 2022/0189575 | A1  | *      | 6/2022 | Seo ........................ | G11C 7/1039 |
| 2022/0270698 | A1  | *      | 8/2022 | Zuolo ................... | G11C 16/102 |
| 2023/0145358 | A1  | *      | 5/2023 | McNeil .............. | G11C 16/0483 |
|              |     |        |        |              | 711/154     |
| 2024/0152423 | A1  | *      | 5/2024 | Swami ................ | G06F 11/1068 |

OTHER PUBLICATIONS

International Search Report and Written Opinion, PCT Application No. PCT/US2024/036771, mailed Oct. 23, 2024, 9 pages.

\* cited by examiner

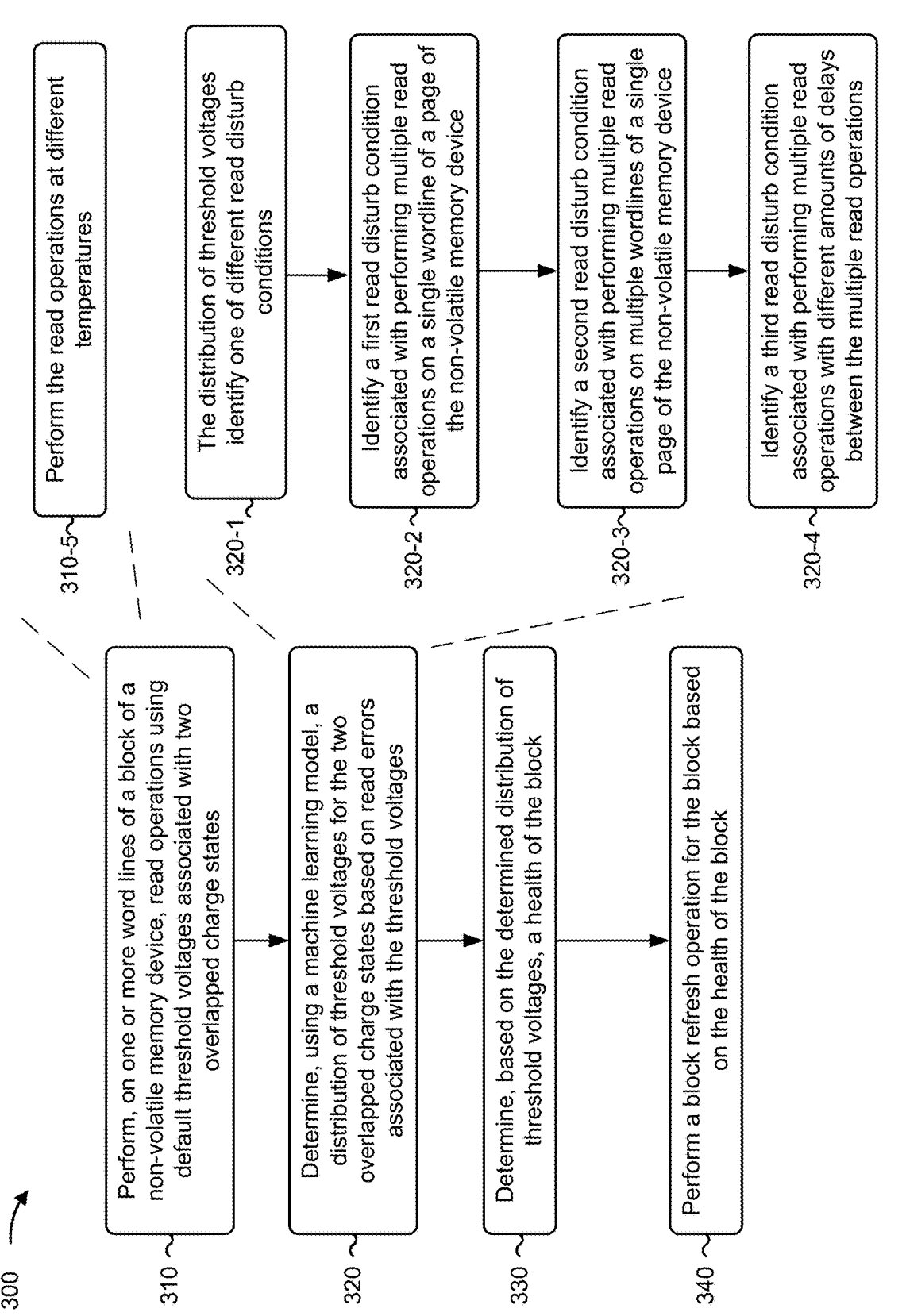

310-5 — Perform the read operations at different temperatures 320-1 — The distribution of threshold voltages identify one of different read disturb conditions 320-2 — Identify a first read disturb condition associated with performing multiple read operations on a single wordline of a page of the non-volatile memory device 320-3 — Identify a second read disturb condition associated with performing multiple read operations on multiple wordlines of a single page of the non-volatile memory device 320-4 — Identify a third read disturb condition associated with performing multiple read operations with different amounts of delays between the multiple read operations

300

310 — Perform, on one or more word lines of a block of a non-volatile memory device, read operations using default threshold voltages associated with two overlapped charge states 320 — Determine, using a machine learning model, a distribution of threshold voltages for the two overlapped charge states based on read errors associated with the threshold voltages 330 — Determine, based on the determined distribution of threshold voltages, a health of the block 340 — Perform a block refresh operation for the block based on the health of the block

FIG. 3A

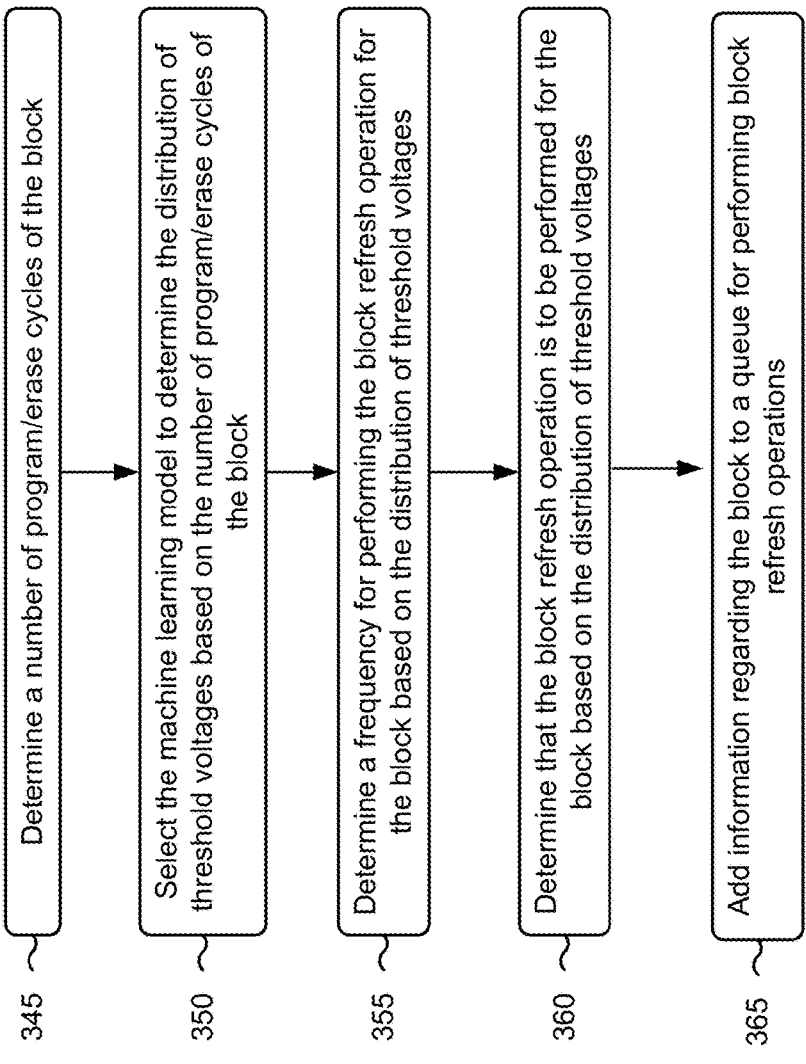

345 — Determine a number of program/erase cycles of the block

350 — Select the machine learning model to determine the distribution of threshold voltages based on the number of program/erase cycles of the block 355 — Determine a frequency for performing the block refresh operation for the block based on the distribution of threshold voltages 360 — Determine that the block refresh operation is to be performed for the block based on the distribution of threshold voltages 365 — Add information regarding the block to a queue for performing block refresh operations

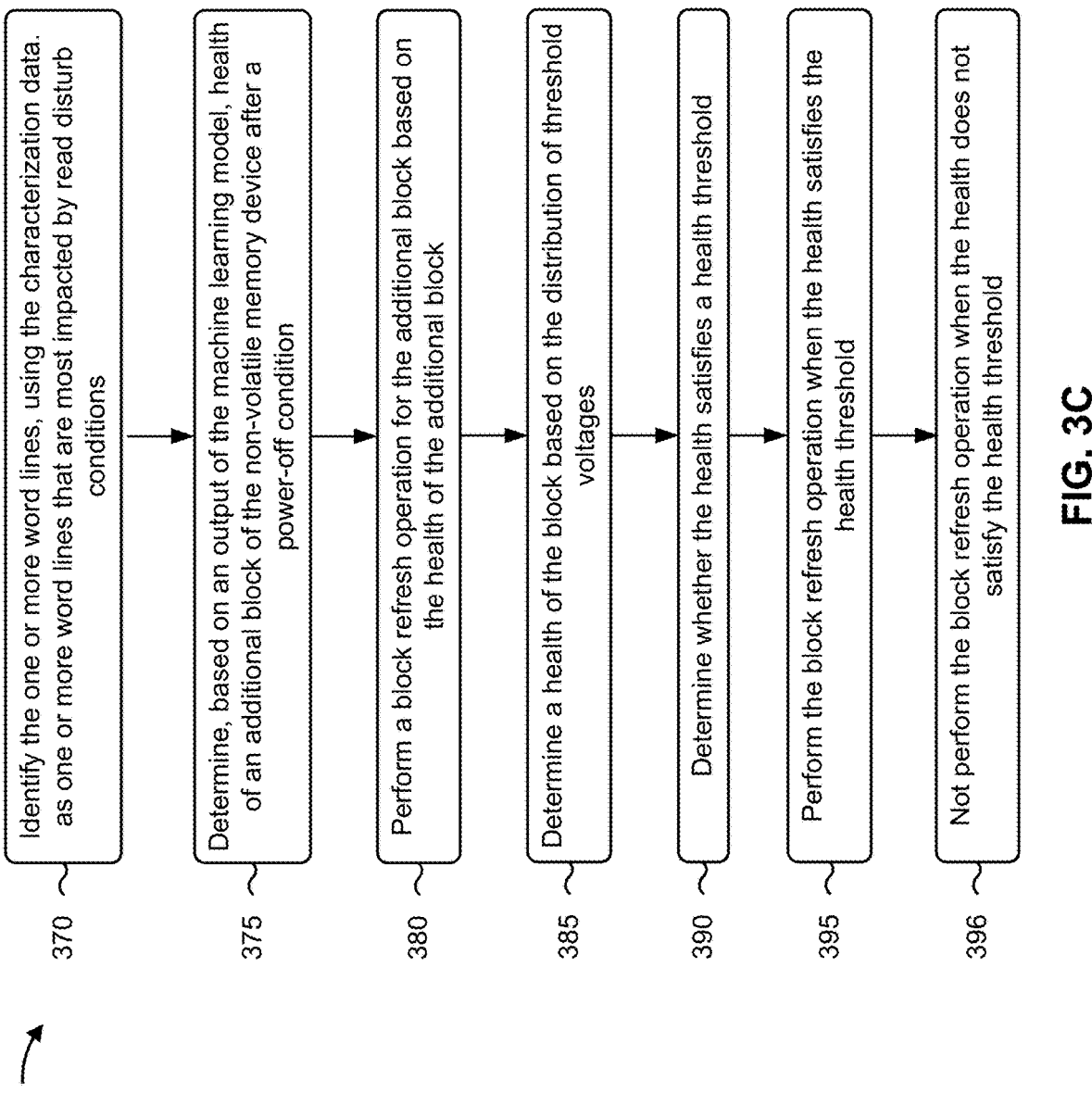

370 Identify the one or more word lines, using the characterization data, as one or more word lines that are most impacted by read disturb conditions 375 Determine, based on an output of the machine learning model, health of an additional block of the non-volatile memory device after a power-off condition 380 Perform a block refresh operation for the additional block based on the health of the additional block 385 Determine a health of the block based on the distribution of threshold voltages 390 Determine whether the health satisfies a health threshold 395 Perform the block refresh operation when the health satisfies the health threshold 396 Not perform the block refresh operation when the health does not satisfy the health threshold

410 Determine, using a machine learning model, a distribution of threshold voltages for two overlapped charge states of the non-volatile memory device 420 Determine whether to perform a block refresh operation for the block based on the shape of the distribution of threshold voltages

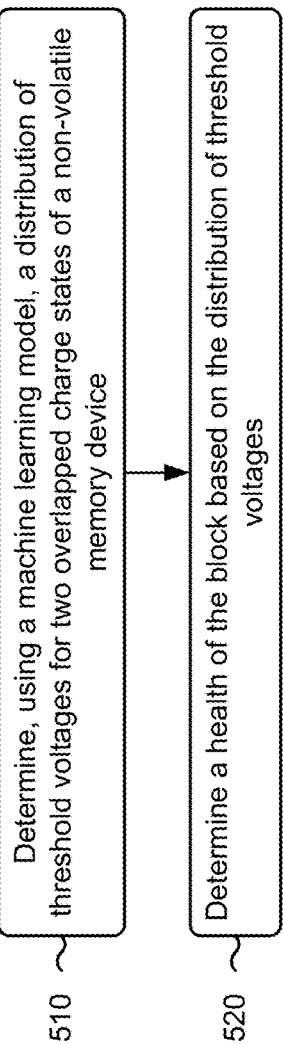
Determine, using a machine learning model, a distribution of threshold voltages for two overlapped charge states of a non-volatile memory device
Determine a health of the block based on the distribution of threshold voltages
510
520
500
FIG. 5

DETERMINING HEALTH OF A BLOCK OF A NON-VOLATILE MEMORY DEVICE BASED ON A DISTRIBUTION OF THRESHOLD VOLTAGES

RELATED APPLICATION

This application claims priority to U.S. Provisional Patent Application No. 63/603,117 entitled "PREDICTION OF READ DISTURB OF A BLOCK OF A NAND FLASH MEMORY DEVICE BASED ON ADAPTIVE MACHINE LEARNING ALGORITHM," filed Nov. 27, 2023, which is incorporated herein by reference in its entirety.

FIELD

The present disclosure generally relates to read disturb of non-volatile memory devices and, for example, relates to determining read disturb (of the non-volatile memory devices) using a machine learning model to maintain data integrity of the non-volatile memory devices.

BACKGROUND

A non-volatile memory device may include a memory device that may store and retain data without external power supply. One example of a non-volatile memory device is a NAND flash memory device. In some situations, a block of the non-volatile memory device may be subjected to multiple read operations on a wordline. The read operations may affect one or more other wordlines of the block and, therefore, compromise data written to the one or more other wordlines of the block.

SUMMARY

In some implementations, a method comprising: performing, on one or more wordlines of a block of a non-volatile memory device, read operations using default threshold voltages associated with two overlapped charge states; determining, using a machine learning model, a distribution of threshold voltages for the two overlapped charge states based on read errors associated with the threshold voltages; determining, based on the determined distribution of threshold voltages, a health of the block; and performing a block refresh operation for the block based on the health of the block, wherein the block refresh operation is performed when the health satisfies a health threshold, and wherein the block refresh operation is not performed when the health does not satisfy the health threshold.

In some implementations, a system comprising: a controller, of a non-volatile memory device, to: determine, using a machine learning model, a distribution of threshold voltages for two overlapped charge states of the non-volatile memory device, wherein the distribution of threshold voltages is determined based on read operations performed on one or more wordlines of a block of the non-volatile memory device; and determine whether to perform a block refresh operation for the block based on the distribution of threshold voltages.

In some implementations, a computer program product comprising: one or more computer readable storage media, and program instructions collectively stored on the one or more computer readable storage media, the program instructions comprising: program instructions to determine, using a machine learning model, a distribution of threshold voltages for two overlapped charge states of a non-volatile memory device, wherein the distribution of threshold voltages is determined based on threshold voltages determined based on read operations performed on one or more wordlines of a block of the non-volatile memory device; and program instructions to determine a health of the block based on the distribution of threshold voltages.

BRIEF DESCRIPTION OF THE DRAWINGS

FIGS. 3A-3C are flowcharts of an example process associated with determining a health of a block using a machine learning model.

FIG. 5 is a flowchart of an example process associated with determining a health of a block using a machine learning model.

DETAILED DESCRIPTION

Figure 1A:
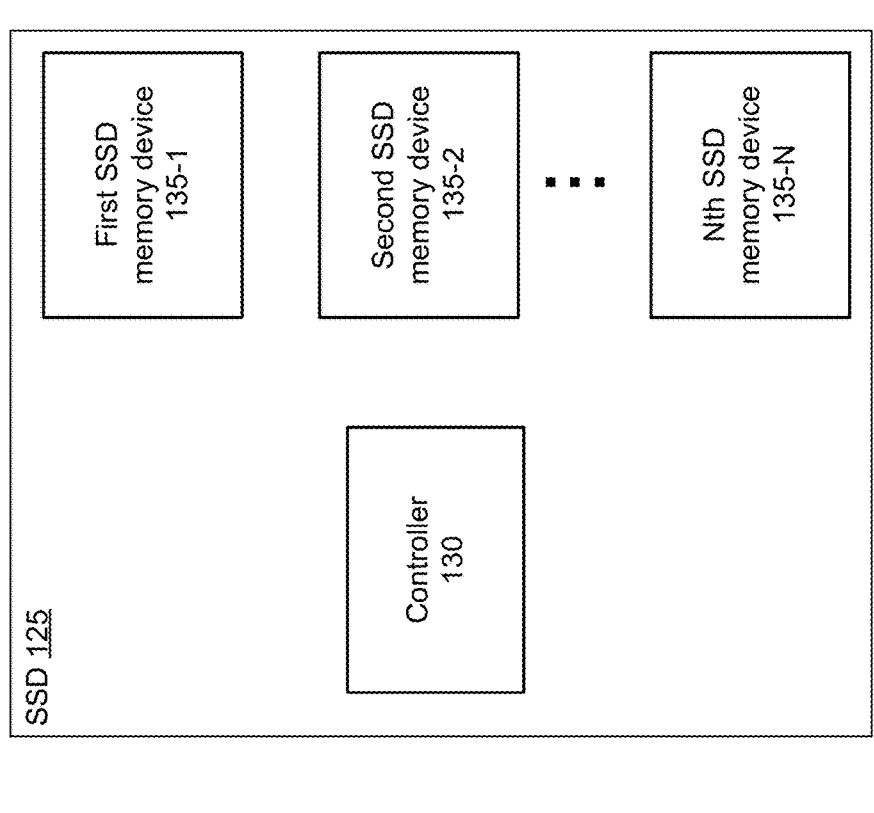
FIGS. 1A-1G are diagrams of an example implementation described herein.

The following detailed description of example implementations refers to the accompanying drawings. The same reference numbers in different drawings may identify the same or similar elements.

A NAND flash memory device is a type of non-volatile memory device. The non-volatile memory device may be included in a solid-state drive (SSD). The SSD may also include a controller that control operations of the non-volatile memory device. The operations may include read operations.

The read operations may be performed on different wordlines of different pages of different blocks (or memory blocks) of the non-volatile memory device. Typically, a controller of the non-volatile memory device may maintain a record of read counts of different blocks of the non-volatile memory device. As an example, the read count of a block may be incremented after a read operation is performed on the block. When the read counts for a first block reaches a read count threshold, a block refresh operation may be performed for the block. For instance, data written to the first block may be written to a second block (after data in the second block has been erased). Subsequently, the data, written to the first block, may then be erased from the first block and the first block may be reused.

The read count threshold, i.e. a single predetermined read count threshold, may be utilized for multiple blocks of the non-volatile memory device. However, utilizing the read count threshold for multiple blocks may be undesirable because of variations from one block to another, from one storage media to another, and from one workload to another. For example, the count threshold may be inappropriate for the first block because the count threshold may subject the first block to more read operations than can be sustained by the first block before a block refresh operation needs to be performed on the first block. Conversely, the count threshold may be inappropriate for the second block because the count threshold may subject the second block to fewer read operations than the second block can sustain before a block refresh operation needs to be performed on the second block.

A memory associated with the controller may store the read counts for the first block and the read count for the second block. In some situations, the SSD may experience a power-off condition that causes a power loss on the non-memory memory device. As a result of the power-off condition, the read counts for the blocks may be erased from the memory. Accordingly, the controller may become unaware of the read counts for the blocks. Therefore, the controller may cause block refresh operations to be performed prematurely or to be untimely performed. As a result of performing block refresh operations in this manner, the data integrity of the non-volatile memory device may be compromised and read latency may increase.

In other words, the read count being erased from the memory (as a result of the power off condition) may cause the block refresh operation to be performed prematurely on the second block. Additionally, the read count being erased from the memory may cause the block refresh operation to be untimely performed on the first block (e.g., performed after the first block has been subjected to effects of read disturb), thereby causing data written to the first block to be compromised. Because the read count is erased from the memory, the controller is unaware of the read count. As a result, the controller may cause the block refresh operation to be performed prematurely or to be untimely performed. In some situations, the read count may be periodically copied to a non-volatile memory. However, the read count (copied to the non-volatile memory) may be outdated by the time of the power off condition. As a result, by relying on the outdated read count, the controller may cause the block refresh operation to be performed prematurely or to be untimely performed. Performing block refresh operations in an untimely manner may compromise the data integrity of the non-volatile memory device and may increase read latency. With respect to the data integrity being compromised, the read disturb may affect a charge on a floating gate of memory cells and potentially in an oxide surrounding the memory cells if electrons migrate into the oxide via quantum effects. Accordingly, the read disturb causes threshold voltages (used to read data stored on the memory cells prior to the read disturb) to no longer be ideal for reading the data stored on the memory cells. For example, using the threshold voltages may cause incorrect values to be read from some memory cells. In this regard, the read disturb may cause the data stored on the memory cells to be corrupted. Prematurely performing the block refresh operation involves premature write operations, which negatively affects an age of the non-volatile memory device and the lifespan of the non-volatile memory device. For example, prematurely performing the block refresh operation may cause write amplification and may also cause additional program/erase cycles, which may reduce the lifespan of the non-volatile memory device.

For at least the foregoing reasons, comparing the read count threshold with the read counts of the blocks may not accurately determine the health of the blocks. Accordingly, determining the health of the blocks independently of read counts and comparison of the determined health to a predetermined, health threshold, may enable block refresh operations to be performed in a timely manner. Performing block refresh operation in a timely manner may maintain the data integrity and may decrease the read latency.

Implementations described herein reduce read latency in read operations performed on a memory device. Implementations described herein maintain or improve data integrity of the memory device, thereby mitigating read latency and compromised data integrity that may occur as a result of untimely or premature block refresh operations. Implementations described herein provide a technical solution to the technical problem of increased read latency in read operations that occur as a result of performing block refresh operations prematurely or in an untimely manner. Additionally, implementations described herein provide a technical solution to the technical problem of compromised data integrity of the memory device as a result of performing block refresh operations in an untimely manner.

Implementations described herein enable block refresh operations to be performed in a more timely manner (e.g., not prematurely and before data is compromised on a block). For example, implementations described herein determine health of blocks of non-volatile memory devices prior to, and subsequent to, a power-off condition. In other words, implementations described herein provide a technical solution to the technical problem of determining the health of a block and performing block refresh operations based on the health, thereby maintaining or even improving data integrity of the memory device prior to, or subsequent to, the power-off condition.

In this regard, implementations described herein are directed to determining the health of a block using one or more machine learning models. For example, implementations described herein are directed to determining a distribution of threshold voltages for two overlapped charge states based on read errors associated with the threshold voltages experienced by the block using the one or more machine learning models and determining the health of the block based on the distribution of threshold voltages. The one or more machine learning models may be trained using characterization data regarding one or more non-volatile memory devices. The distribution of threshold voltages may identify one of different read disturb conditions for two overlapped charge states. In some situations, the characterization data may identify the different threshold voltages for the different types of read disturb conditions after different program/erase cycles. For example, the characterization data may identify different threshold voltages (associated with the two overlapped charge states) as a result of the read disturb conditions after different program/erase cycles.

The read disturb conditions may include a read disturb condition associated with performing multiple read operations on a single page of a block of the non-volatile memory device (also referred to as "single page read disturb"). The read disturb conditions may include a read disturb condition associated with performing multiple read operations on multiple pages of a block of the non-volatile memory device (also referred to as "block read disturb"). The read disturb conditions may include a read disturb condition associated with performing multiple read operations with different amounts of delays between the multiple read operations of a block of the non-volatile memory device (also referred to as "latent read disturb"). The multiple read operations may be performed at different temperatures and different program/erase cycles. A threshold voltage may be a voltage used to read data stored by a memory cell of a non-volatile memory device.

The health of the block may be determined based on a valley formed by threshold voltages of two overlapped charge states, as explained herein. A shape of the valley may capture a signature of read disturb associated with the block. As an example, the signature of read disturb may include threshold voltages that result in read errors when used to read data stored on a wordline (of the block) that has been subjected to read disturb. The valley may include an upper tail of one charge state and a lower tail of a next charge state. In this regard, a range of threshold voltages may include threshold voltages associated with the upper tail of one charge state to threshold voltages associated with the lower tail of the next charge state. The health of the block may be determined based on the shape of the valley instead of a read count for the block. In other words, the shape of the valley may be used to determine (or predict) the health of the block after the wordline has been subjected to read disturb. In this regard, using the shape of the valley may provide a more accurate health of the block than using actual read counts compared to a fixed threshold. In some examples, the shape of the valley may indicate a level of read disturb to which the wordline has been subjected. The level of read disturb may indicate the health of the block. There is no requirement to identify the level of read disturb, and thus the health of the block may be determined based on the shape of the valley.

As used herein, "overlapped charge states" may refer to adjacent charge states, as described herein. For example, no charge states may be provided between the overlapped charge states. As an example, overlapped charges states may refer to charge states with threshold voltage windows that may overlap. In some examples, the two overlapped charge states may be associated with lowest threshold voltages because the wordline may be an unprogrammed wordline. Typically, memory cells associated with lowest threshold voltages are most impacted by read disturb. Accordingly, the valley of the overlapped charges states (with lowest threshold voltages) may be a good proxy for the health of the block.

The one or more machine learning models may be trained by one or more computing devices that are arranged to train machine learning models. In this regard, the one or more computing devices may determine different threshold voltages after wordlines (of one or more non-volatile memory devices) have been subjected to read conditions over different program/erase cycles. The characterization data may identify one or more of the different threshold voltages, different temperatures, different delays, read errors associated with the different threshold voltages, and bit error rates associated with the different threshold voltages.

In some situations, the one or more non-volatile memory devices may have undergone different program/erase cycles. In this regard, the characterization data may identify different program/erase cycles associated with different threshold voltages. The one or more computing devices may train the one or more machine learning models using the characterization data. In some examples, the one or more machine learning models may receive bit error rates corresponding to pre-determined threshold voltages as inputs and perform a regression analysis to determine health of the block, as a result of read disturb (e.g., an amount (or an effect) of read disturb) subjected to one or more wordlines of a block as an output. For example, the one or more machine learning models may determine a valley formed by threshold voltages of two overlapped charge states and based on, the valley (or a shape of the valley), the output may indicate health of the block at least partially responsive to the amount (or the effect) of read disturb. In some implementations, the different threshold voltages may include pre-determined threshold voltages that include threshold voltages predetermined by a manufacturer of the non-volatile memory devices.

In some examples, the one or more computing devices may train a single machine learning model (e.g., a single neural network) using the characterization data that identifies one or more of the different threshold voltages, the different temperatures, the different delays, and or the different program/erase cycles, among other examples. In some examples, the one or more computing devices may train different machine learning models for different program/ erase cycles. For example, the one or more computing devices may train a first machine learning model using different threshold voltages for a first number of program/ erase cycles as a result of first read disturb conditions, train a second machine learning model using different threshold voltages for a second number of program/erase cycles as a result of second read disturb conditions, and so on. In this regard, different machine learning models may be trained using data regarding different respective read disturb conditions across different program/erase cycles in different possible combinations.

After training the one or more machine learning models, the one or more computing devices may provide the one or more trained machine learning models to a controller of a non-volatile memory device. For example, the controller may be a firmware microcontroller (e.g., a controller that performs operations using firmware). The controller may use the one or more trained machine learning models to determine the health of the block. The one or more trained machine learning models may be different based on program/erase cycles. For example, one trained machine learning model may be trained based on data regarding a first number of program/erase cycles, another trained machine learning model may be trained based on data regarding a second number of program/erase cycles, and so on. In some situations, the controller may determine the number of program/erase cycles of the one or more blocks and may select a machine learning model trained using a portion of the characterization data (e.g., threshold voltages corresponding to the number of program/erase cycles). Alternatively, the controller may select a machine learning model trained using an entirety of the characterization data.

As explained herein, the health of the block may be determined based on a valley formed by threshold voltages of two overlapped charge states. For example, the characterization data may identify different shapes of the valley and may be used to train a selected machine learning model to determine a shape of the valley based on an input (e.g., data points such as bit error rates). In this regard, as part of an inference, the selected trained machine learning model may determine the shape of the valley based on the input and determine the health of the block based on the shape of the valley. Based on the shape of the valley, the controller may determine a read disturb condition experienced by the block and may determine the health of the block based on the read disturb condition. In another example, based on the shape of the valley, the controller may determine the health of the block. In other words, the shape of the valley may be used to determine (or predict) the health of the block as a result of the read disturb condition experienced by the block. The shape of the valley may represent a proxy of read counts of the block. This proxy for read counts may indicate the health of the block. In some situations, the controller may determine the number of read counts of the block based on the shape of the valley.

Based on the health of the block, the controller may determine whether a block refresh operation is to be performed on the block. For example, the controller may cause the block refresh operation to be performed if the health satisfies a health threshold. By determining the health of the block in this manner, implementations described herein may enable block refresh operations to be performed in a more timely manner. Accordingly, implementations described herein maintain or improve data integrity of the non-volatile memory device, improve read latency of the non-volatile memory device, and may also enhance the lifetime of the drive.

In some situations, after a power-on condition following a power-off condition, the controller may perform read operations on one or more candidate wordlines on individual blocks, as desired. For example, the one or more candidate wordlines may be wordlines that are most affected by read disturb. In some examples, the controller may perform the read operations, on the one or more candidate wordlines, using the default threshold voltages. In some situations, the one or more candidate wordlines may be wordlines that have been identified, by the controller, as good proxies for the health of the non-volatile memory device. The controller may use read errors (or bit error rates) associated with the default threshold voltages (used to perform the read operations) as inputs to the selected machine learning model. In some situations, based on the inputs, the selected machine learning model may determine (or reconstruct) the valley shape and, based on the valley shape, the selected machine learning model may determine the health of the individual blocks after the power-on condition following the power-off condition.

Additionally, the controller may determine the health for other blocks of the non-volatile memory device after a power-off condition occurs on the non-volatile memory device. The health for the other blocks may be determined in a manner similar to the manner described herein. By determining the health for the other blocks in this manner, implementations described (as disclosed herein and in the appendix incorporated herein in its entirety) may determine the health of different blocks.

In some examples, the non-volatile memory device may be a multi-level cell (MLC) memory device, a triple-level cell (TLC) memory device, or a quad-level cell (QLC) memory device. While some examples described herein are directed to TLC memory devices, implementations described herein are applicable to other types of non-volatile memory devices or other non-volatile memory devices.

FIGS. 1A-1G are diagrams of an example implementation 100 associated with determining the health of a block of a non-volatile memory device described herein. As shown in FIG. 1, example implementation 100 includes model training platform 110 which may include a machine learning model 115, a first training memory device 120-1, a second training memory device 120-2, up to an mth training memory device 120-M (collectively "training memory devices 120" and individually "training memory device 120"), and an SSD 125.

Model training platform 110 may include one or more devices that train one or more machine learning models, as explained herein. Model training platform 110 may include a communication device and a computing device. For example, model training platform 110 may include a server, a laptop computer, a desktop computer, or a similar type of device. In some implementations, model training platform 110 may be a computing device that is part of a computing environment. The communication device may include an interface for communicating with other devices and the computing device may include a combination of one or more processors, controllers, firmware, software, and/or other logic configured to execute computing operations.

As shown in FIG. 1A, model training platform 110 may include machine learning model 115. Model training platform 110 may train machine learning model 115 and provide machine learning model 115 to a controller 130 of SSD 125. In some situations, model training platform 110 may train multiple machine learning models 115. In this regard, model training platform 110 may train and provide one or more machine learning models 115 to SSD 125, i.e. to the controller 130 of SSD 125.

Machine learning model 115 may be trained to determine threshold voltages associated with read disturb conditions experienced by different blocks of different non-volatile memory devices. For example, machine learning model 115 may be trained to determine a change in threshold voltages (associated with read operations) for a block of a non-volatile memory device as a result of read disturb conditions experienced by the block. In some examples, machine learning model 115 may include a neural network model. Additionally, machine learning model 115 may be trained to determine the health of the different blocks.

A training memory device 120 may include a non-volatile memory device, such as a flash memory device. The training memory device 120 may include a TLC NAND flash memory device. Alternatively, the training memory device 120 may include a single-level cell (SLC) non-volatile memory device. Alternatively, the training non-volatile memory device 120 may include a multi-level cell (MLC) memory device. Alternatively, the training memory device 120 may include a quad-level cell (QLC) non-volatile memory device.

The training memory device 120 may be used to generate characterization data (e.g., training data) that is used to train machine learning model 115. In some examples, the characterization data may include different bit error rates corresponding to different threshold voltages used to perform read operations on the training memory device 120 (with the read operations resulting in read errors).

Figure 1B:
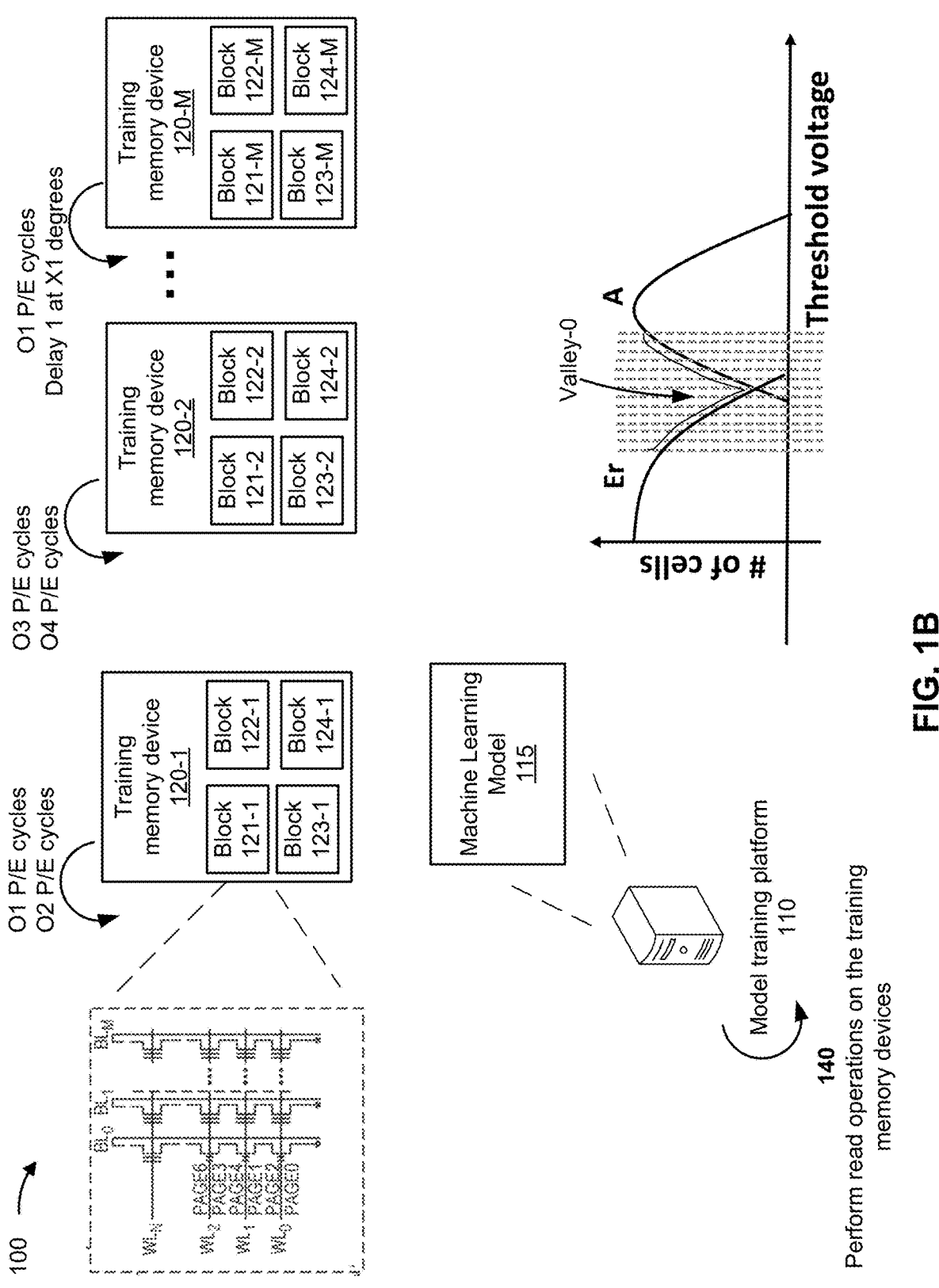

The training memory device 120 may include multiple blocks (or memory blocks) and a block may include multiple wordlines. As shown in FIG. 1B, for example, first training memory device 120-1 may include a first block 121-1, a second block 122-1, and so on. As shown in FIG. 1B, for example, first block 121-1 may include multiple wordlines (e.g., $WL_0$, $WL_1$, and so on) and may include multiple bitlines (e.g., $BL_0$, $BL_1$, and so on).

Referring back to FIG. 1A, SSD 125 may include a solid-state memory device. As shown in FIG. 1A, SSD 125 may include a controller 130, a first SSD memory device 135-1, a second SSD memory device 135-2, up to an nth SSD memory device 135-N (collectively "SSD memory devices 135" and individually "SSD memory device 135").

Controller 130 may include one or more devices to perform operations on SSD memory devices 135. For example, controller 130 may perform read operations, program (write) operations, and erase operations. In some examples, controller 130 may include an application-specific integrated circuit (ASIC) controller. In some examples, controller 130 may include a controller that performs operations using firmware stored on a memory of controller 130 (e.g., stored on a random access memory or read only memory).

In some examples, controller 130 may determine threshold voltages experienced by blocks of a non-volatile memory device and determine the health of the blocks based on the threshold voltages. In some situations, controller 130 may receive machine learning model 115 from model training platform 110 after machine learning model 115 has been trained. Controller 130 may use machine learning model 115 to determine shapes of different valleys (of overlapped charge states) associated with the read disturb conditions and determine the health of the blocks based on the shapes of the different valleys.

An SSD memory device 135 may include a non-volatile memory device, such as a flash memory device. The SSD memory device 135 may store data of a host computing device (not shown) connected to SSD 125. The SSD memory device 135 may include multiple blocks, respective blocks having multiple wordlines, in a manner similar to the manner explained above in connection with the training memory device 120. The SSD memory device 135 may include an SLC non-volatile memory device, an MLC non-volatile memory device, a TLC non-volatile memory device, a quad-level cell (QLC) non-volatile memory device, or a penta-level cell (QLC) non-volatile memory device.

While examples herein may be described with respect to NAND flash memory device, implementations described herein may be applicable to other types of non-volatile memory devices, such as ferroelectric random-access memory (FeRAM), magnetic random-access memory (MRAM), phase-change memory (PCM), or NOR flash memory devices, among other examples.

As shown in FIG. 1B, training memory devices 120 may experience different program/erase cycles and may be subjected to different read disturb conditions. For example, a first block of first training memory device 120-1 may experience a first number of program/erase cycles and a single wordline of the first block may be subjected to multiple read operations, a second block of second training memory device 120-2 may experience a second number of program/erase cycles and multiple wordlines of the second block may be subjected to multiple read operations, a third block of third training memory device 120-3 may experience a third number of program/erase cycles and one or more wordlines of the third block may be subjected to multiple read operations and delays, among other examples. The program/erase cycles may cause training memory devices 120 to experience read disturb conditions. In other words, training memory devices 120 may experience losses of electrons.

As shown in FIG. 1B, and by reference number 140, model training platform 110 may perform read operations on the training memory devices. In some implementations, after training memory devices 120 have experienced different program/erase cycles and have been subject to different read disturb conditions, read operations may be performed on training memory devices 120. In some situations, the read operations may be performed by controllers provided with training memory devices 120. Alternatively, the read operations may be performed by model training platform 110.

For example, a block of first training memory device 120-1 may be subjected to a first number (or a first range) of program/erase cycles and a first wordline (e.g., $WL_1$) of the block may be subjected to a first number (or a first range) of read operations. As a result, a second wordline (e.g., $WL_0$ or $WL_2$), adjacent to the first wordline, may be subjected to read disturb. For example, the first number of read operations may alter threshold voltages of memory cells of the second wordline as a result of the first number of read operations performed on the first wordline.

Subsequent read operations may be performed on the second wordline using pre-determined first threshold voltages. The pre-determined first threshold voltages may be included in in a first range of threshold voltages for a first charge state and a second range of threshold voltages for a second charge state. The first charge state and the second charge state may be overlapped charge states. In some examples, the subsequent read operations may include tens of read operations performed using the pre-determined first threshold voltages. Because the second wordline has been subjected to read disturb, performing the subsequent read operations using the pre-determined first threshold voltages may result in read errors.

In some examples, the first range of threshold voltages for the first charge state may be represented by a first curve and the second range of threshold voltages for the second charge state may be represented by a second curve. In other words, the curves may be graphical representations of the threshold voltages. In some situations, the first curve and the second curve may overlap (e.g., based on the first charge state and the second charge state may be overlapped charge states). A shape of a curve (of a charge state) may indicate a probability distribution for the charge of one or more cells when programmed to a particular value. When multiple curves overlap (such as the first curve and the second curve), then the overlapping region may indicate that the charge in the one or more cells could indicate either the Er state of the A state. The overlapping region may include the valley. The lowest point in the valley created by the overlap gives the best statistical probability that distinguishes the Er state from the A state. Thus, knowing (or predicting via ML) the shape of the curve and the lowest point of the valley increases the likelihood of reading the correct state for the one or more cells.

As shown in FIG. 1B, in some examples, the two overlapped charge states may be associated with lowest threshold voltages of first training memory device 120-1 because the second wordline may be an unprogrammed wordline. Accordingly, the threshold voltages associated with the one or more other wordlines may be the lowest threshold voltages.

As shown in FIG. 1B, in some examples, the two overlapped charge states may be associated with lowest threshold voltages of first training memory device 120-1 because the second wordline may be an unprogrammed wordline. Accordingly, the threshold voltages associated with the one or more other wordlines may be the lowest threshold voltages.

The second wordline may be more susceptible to a migration of electrons (e.g., influx of electrons) associated with read disturb. As shown in FIG. 1B, the number of cells graphed vs. the pre-determined first threshold voltages may form a valley (e.g., valley-0). FIG. 1B thus illustrates a probability density plot as a function of threshold voltages, where the y axis represents the number of cells that have a given voltage as per the x axis. Typically, memory cells associated with lowest threshold voltages are most impacted by read disturb. Accordingly, the valley of the overlapped charges states (with lowest threshold voltages) may be a good proxy for the health of the cell. Typically, a TLC memory cell may be associated with eight possible charge states to represent a combinations of 3-bit values that the TLC memory cell may hold. A charge state may be represented by a curve of increasing threshold voltage. Accordingly, the charge states may be represented by eight curves. Overlapping curves may form a valley. Accordingly, the eight curves may form seven valleys. The valley associated with the lowest threshold voltages may be referred to as "valley-0." The overlapped charge states associated with the lowest threshold voltages (and thus forming valley-0) may be most impacted by read disturb. In some examples, based on the read errors, the first pre-determined threshold voltages may be adjusted (e.g., increased) to obtain adjusted first voltage threshold voltages. The adjusted first threshold voltages may be used to successfully perform read operations on the second wordline. The adjusted first threshold voltages may form a second shape of the valley (not shown) different than a first shape of the valley (formed by the first pre-determined threshold voltages).

Subsequently to successfully performing the read operations on the second wordline with the adjusted first threshold voltages, first training memory device 120-1 may be subjected to a second number (or a second range) of program/erase cycles and the first wordline may be subjected to a second number (or a second range) of read operations. In other words, performing the second number of read operations on the first wordline may cause the second wordline to be subjected to a single page read disturb.

Because the second wordline has been subjected to the single page read disturb, performing additional read operations on the second wordline using the adjusted first threshold voltages may result in read errors. Accordingly, in order to successfully perform read operations on the second wordline, the adjusted first threshold voltages may be adjusted (as described herein) to a further adjusted first threshold voltages. The further adjusted first threshold voltages may form a third shape (not shown) of the valley different than the first shape and the second shape.

In some situations, a shape of the valley may indicate a level of read disturb (e.g., a level of negative impact of the read disturb on a wordline). For example, the first shape may indicate a first level of read disturb, the second shape may indicate a second level of read disturb that exceeds the first level (e.g., due to the additional program/erase cycles and read operations), the third shape may indicate a third level of read disturb that exceeds the first level and the second level (e.g., due to the additional program/erase cycles and read operations), and so on.

In some situations, a shape of the valley may be a proxy for a number of read counts. For example, the first shape may be a proxy for a first read count range, the second shape may be a proxy for a second read count range that exceeds the first read count range, the third shape may be a proxy for a third read count range that exceeds the first read count range and the second read count range, and so on.

The process described herein may be repeated for different numbers of program/erase cycles. The process described herein may be performed on one or more additional training memory devices 120, for other read disturb conditions, in a similar manner.

For example, the process may be performed on a block of second training memory device 120-2 to cause one or more wordlines of the block to be subjected to a uniform block read disturb. For instance, the block of second training memory device 120-2 may be subjected to a second number (or a second range) of program/erase cycles and a first wordline (e.g., $WL_0$) and a second wordline (e.g., $WL_2$) of the block may be subjected to a first number (or a first range) of read operations. As a result, a third wordline (e.g., $WL_1$) may be subjected to read disturb.

Subsequent read operations may be performed on the third wordline using pre-determined second threshold voltages. The pre-determined second threshold voltages may be included in overlapped charge states. In some examples, the two overlapped charge states may be associated with lowest threshold voltages. Because the third wordline has been subjected to read disturb, performing the subsequent read operations using the pre-determined second threshold voltages may result in read errors.

The third wordline may be more susceptible to a migration of electrons (e.g., influx of electrons) associated with read disturb. In some examples, based on the read errors, the pre-determined second threshold voltages may be adjusted (e.g., increased) to obtain adjusted second voltage threshold voltages. The adjusted second threshold voltages may be used to successfully perform read operations on the third wordline. The second pre-determined threshold voltages may form a first shape (not shown) of the valley and the adjusted second threshold voltages may form a second (not shown) of the valley different than the first shape.

Subsequently to successfully performing the read operations on the third wordline, second training memory device 120-2 may be subjected to a fourth number (or a fourth range) of program/erase cycles and the first and second wordlines may be subjected to a second number (or a second range) of read operations. In other words, performing the second number of read operations may cause the third wordline to be subjected to a uniform block read disturb.

Because the third wordline has been subjected to the uniform block read disturb, performing additional read operations on the third wordline using the adjusted second threshold voltages may result in read errors. Accordingly, in order to successfully perform read operations on the third wordline, the adjusted second threshold voltages may be adjusted (as described herein) to further adjusted second threshold voltages. The further adjusted second threshold voltages may form a third valley (not shown) of a shape different than the shape of the first valley and the shape of the second valley.

The process described herein may be performed on a block of third training memory device 120-3 to cause one or more wordlines of the block to be subjected to latent read disturb. Latent read disturb may refer to a read disturb mechanism (or condition) associated with a delay (e.g., thirty seconds) between read operations. For instance, the block of third training memory device 120-3 may be subjected to a fourth number (or a fourth range) of program/erase cycles and a first wordline (e.g., $WL_0$) of the block may be subjected to a first number (or a first range) of read operations. Delays may be included between the read operations. In some situations, the read operations may be performed at different temperatures.

As a result, a second wordline (e.g., $WL_1$) may be subjected to read disturb. Subsequent read operations may be performed on the second wordline using pre-determined third threshold voltages. The pre-determined third threshold voltages may be included in overlapped charge states. In some examples, the two overlapped charge states may be associated with lowest threshold voltages. Because the second wordline has been subjected to read disturb, performing the subsequent read operations using the pre-determined third threshold voltages may result in read errors. The second wordline may be more susceptible to a migration of electrons (e.g., influx of electrons) associated with read disturb.

In some examples, based on the read errors, the pre-determined third threshold voltages may be adjusted (e.g., increased) to obtain adjusted third voltage threshold voltages. The adjusted third threshold voltages may be used to successfully perform read operations on the second wordline. The pre-determined third threshold voltages may form a first shape of a valley (not shown) and the adjusted third threshold voltages may form a second shape of the valley (not shown) different than the first shape. The process may be repeated multiple times resulting in additional shapes of the valley.

Figure 1C:
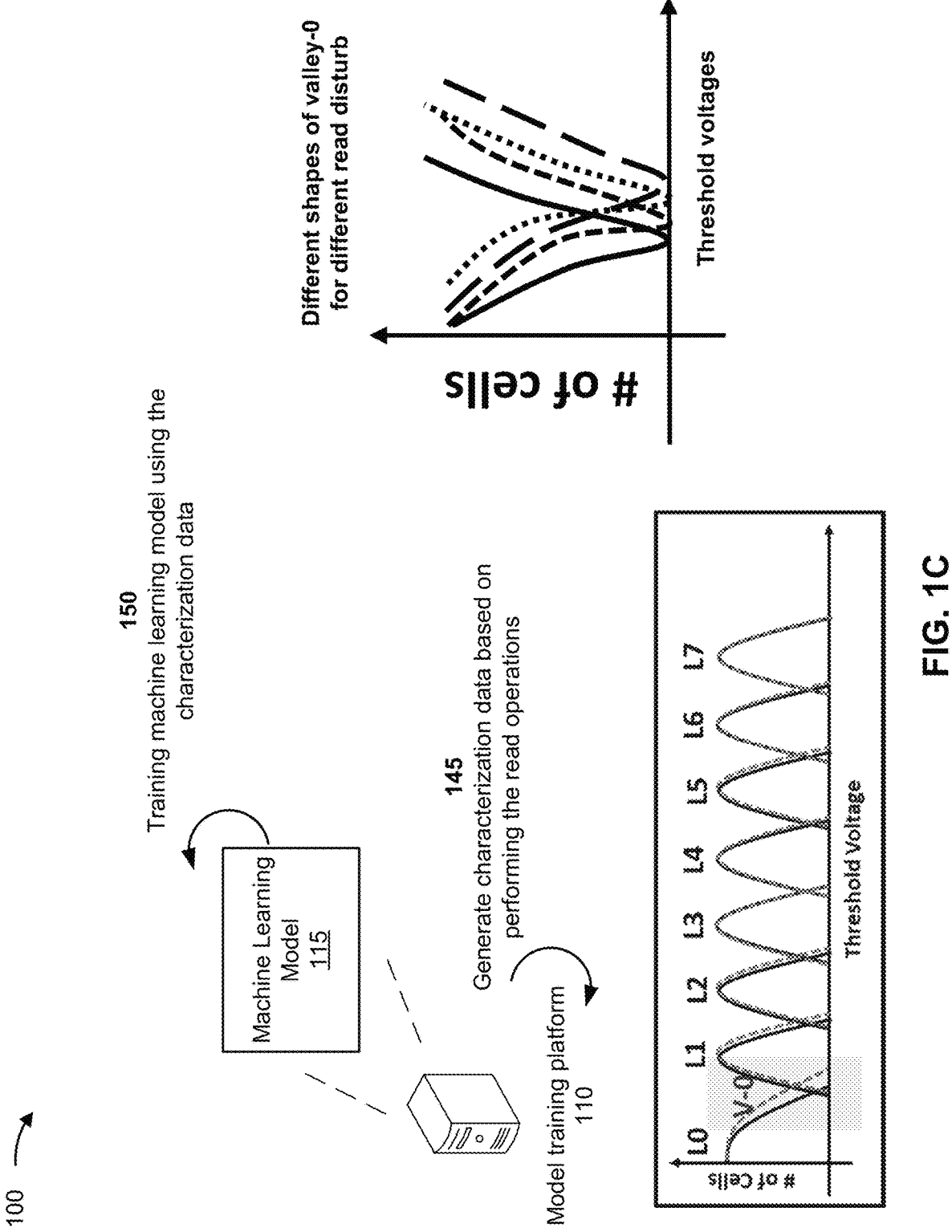

As shown in FIG. 1C, and by reference number 145, model training platform 110 may generate characterization data. The characterization data may include training data that is used to train machine learning model 115. The characterization data may be generated based on performing the read operations to determine or observe read disturb effects for the different P/E cycles, as explained herein. Different machine learning models may be trained for different P/E cycle conditions with various read disturb condition in different possible combinations. As additional read operations are performed, a shape of a valley may be determined along with a manner in which the shape is being affected by the additional read operations. The shape of the valley may reflect threshold voltages used for subsequent read operations, such that the subsequent read operations are performed with fewer bit errors.

The characterization data may include information regarding the pre-determined first threshold voltages, regarding the read errors associated with using the pre-determined first threshold voltages, regarding the adjusted first threshold voltages, regarding the bit errors (or read errors) associated with using the adjusted first threshold voltages, or regarding wordlines associated with the read errors, without limitation.

As shown in FIG. 1C, the characterization data may include different valley shapes for different wordlines, subjected to read disturb, for different P/E cycles (or for different ranges of P/E cycles). For example, as shown in FIG. 1C, the valley-0 shape (for a first range of P/E cycles and a first number of read operations) is illustrated by a solid line, the valley-0 shape (for a second range of P/E cycles and a second number of read operations) is illustrated by a dashed line of a first pattern, the valley-0 shape (for a third range of P/E cycles and a third number of read operations) is illustrated by a dashed line of a second pattern, and so on. The different valley-0 shapes may illustrate shifts in threshold voltages associated with the overlapped states with lowest threshold voltages. The threshold voltages may be shifted toward higher threshold voltages as the P/E cycles increase. The different valley-0 shapes may identify different levels of read disturb and may be a proxy for different read counts, and a proxy for health of a block containing the wordlines.

The characterization data may include information regarding the pre-determined second threshold voltages, regarding the read errors associated with using the pre-determined second threshold voltages, regarding the adjusted second threshold voltages, regarding the read errors associated with using the adjusted second threshold voltages, or regarding wordlines associated with the read errors, without limitation.

The characterization data may include information regarding the pre-determined third threshold voltages, regarding the read errors associated with using the pre-determined third threshold voltages, regarding the adjusted third threshold voltages, regarding the read errors associated with using the adjusted third threshold voltages, or regarding wordlines associated with the read errors, without limitation.

With respect to first training memory device 120-1, for example, the characterization data may identify the first number of program/erase cycles, the pre-determined first threshold voltages, and the adjusted first threshold voltages. In this regard, the characterization data may identify a change in threshold voltages (for the overlapped charge states) that may occur as a result of read disturb.

As shown in FIG. 1C, as an example, the characterization data may identify threshold voltage distributions including different ranges of threshold voltages for different charge states. In some examples, the graph of FIG. 1C may indicate a probability of an individual cell having a particular threshold voltage due to a number of electrons on the floating gate and the charge trap layer. In this regard, the Y-axis may indicate a curve created by an integration of all the individual cells of a block. Thus, the Y-axis may represent the number of cells exhibiting the respective threshold voltage.

As shown in FIG. 1C, and by reference number 150, model training platform 110 may train machine learning model 115 using the characterization data. In some implementations, model training platform 110 may train machine learning model 115 to determine effects of read disturb experienced by a block of a non-volatile memory device based on bit error rates corresponding to pre-determined threshold voltages (e.g., based on read errors caused by pre-determined threshold voltages). For example, machine learning model 115 may be trained to determine a shape of a valley (e.g., valley-0) for the block. The shape of the valley may be a proxy for a level of read disturb experienced by a wordline of the block. The health of the block may be determined based on the shape of the valley. In some implementations, model training platform 110 may train machine learning model 115 to determine the health of the block of a non-volatile memory device based on bit error rates corresponding to pre-determined threshold voltages (e.g., based on read errors caused, over a period of time, by pre-determined threshold voltages).

Training memory device 120 may include different types of non-volatile memory devices. In some situations, the different types of non-volatile memory devices may be manufactured by different manufacturers. Accordingly, machine learning model 115 may be trained to determine different shapes of the valley (e.g., valley-0) for the different types of non-volatile memory devices.

In some examples, machine learning model 115 may receive, as an input, bit error rates corresponding to pre-determined threshold voltages that caused read errors, program erase cycles, and temperatures, among other examples. Machine learning model 115 may provide, as an output, information regarding the health of blocks for the different types of non-volatile memory devices. For example, machine learning model 115 may provide, as an output, information regarding a current shape of the valley for the different types of non-volatile memory devices. In some implementations, machine learning model 115 may provide information indicating that a block refresh is to be performed (e.g., with or without information regarding the current shape of the valley). For example, machine learning model 115 may provide, as an output, information regarding the health of the block, or a decision regarding block refresh.

As shown in FIG. 1C, the characterization data may be used to determine different valley shapes (e.g., valley-0 shapes) for wordlines under read disturb for different program/erase cycles. In some examples, a shift of the shapes toward the highest threshold voltages may indicate changes in threshold voltages due to migration of electrons caused by read disturb. In this regard, the shift of the shapes toward the highest threshold voltages may indicate increased read disturb.

While the example described has been provided with respect to overlapped charge states with lowest threshold voltages, implementations described herein may be applicable to other overlapped charge states. In some implementations, machine learning model 115 may be trained by a computing device other than model training platform 110. In some implementations, model training platform 110 may train multiple machine learning models 115 associated with different program/erase cycles. For example, model training platform 110 may train a first machine learning model using the characterization data of different data retention conditions after a first program/erase cycle (or after a first range of program/erase cycles); may train a second machine learning model using the characterization data of different data retention conditions after a second program/erase cycle (or after a ran range of program/erase cycles); and so on.

Figure 1D:
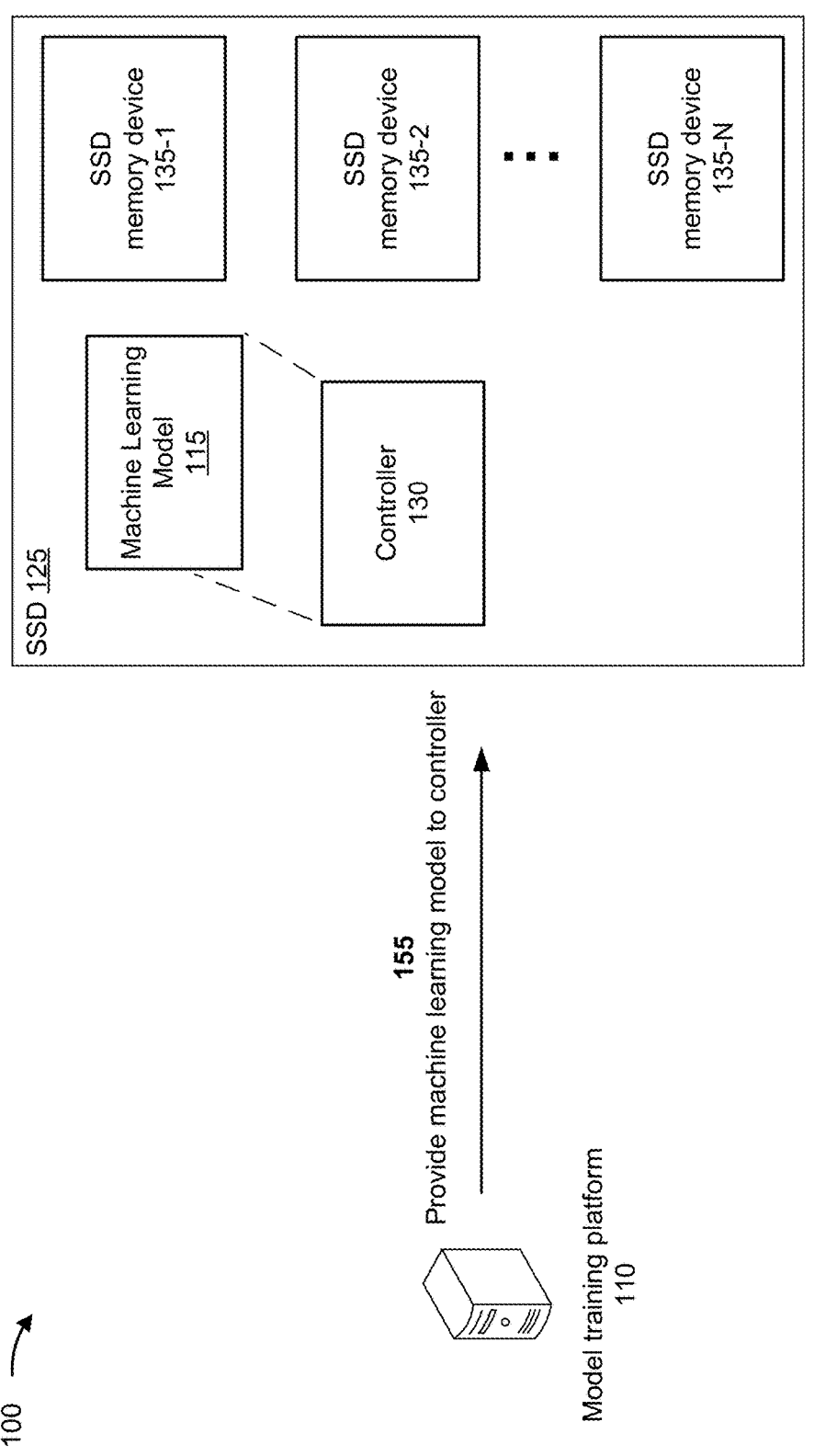

As shown in FIG. 1D, and by reference number 155, model training platform 110 may provide a machine learning model (e.g., machine learning model 115) to controller 130. For example, after training machine learning model 115, model training platform 110 may provide machine learning model 115 to the controller 130. In some implementations, controller 130 may use machine learning model 115 to determine the health of a block of a non-volatile memory device and the controller may determine whether to perform a block refresh operation on the block based on the health of the block.

Figure 1E:
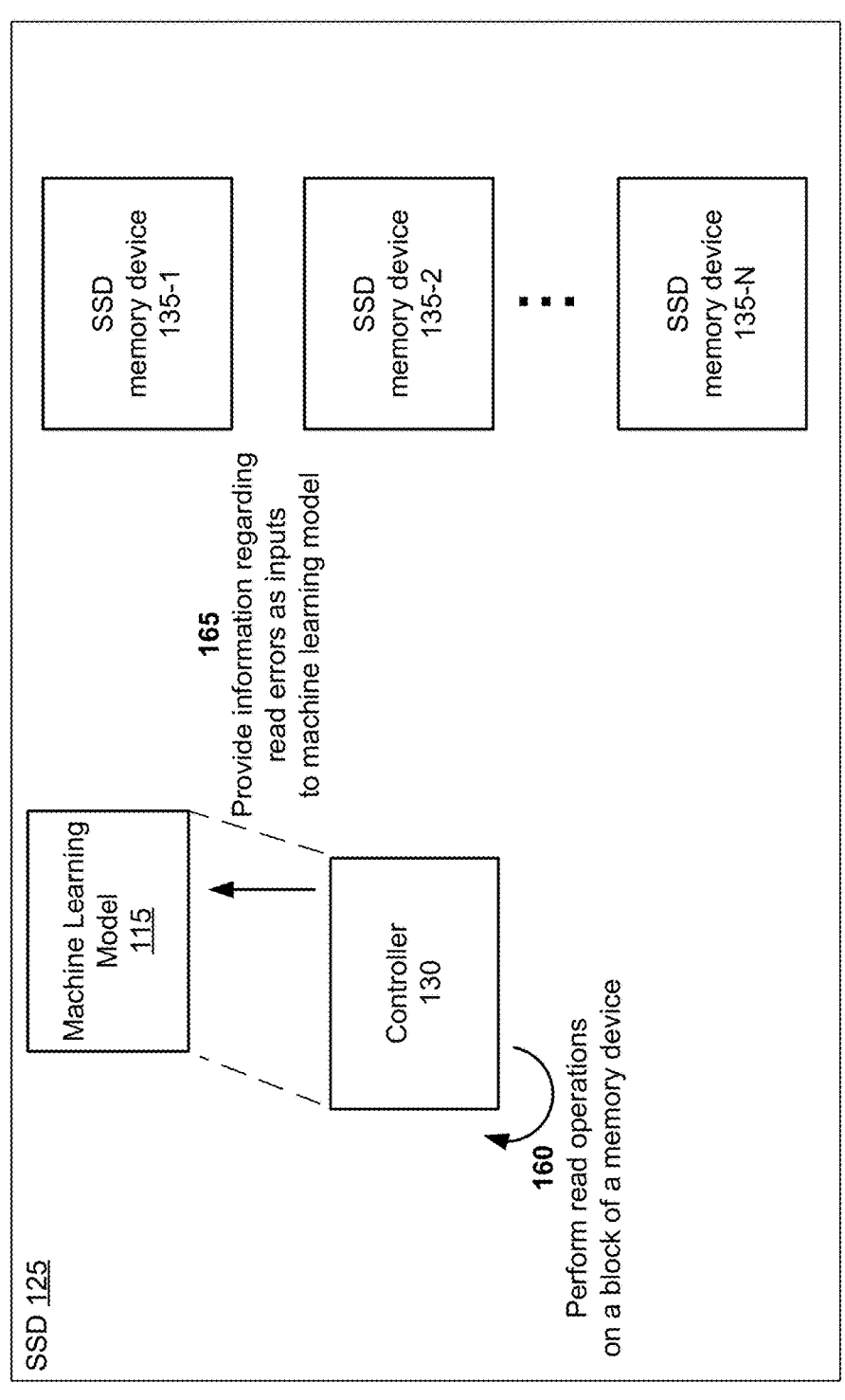

As shown in FIG. 1E, and by reference number 160, controller 130 may perform read operations on a block of a memory device (e.g., a non-volatile memory device). For example, controller 130 may perform read operations on a page of a block of first SSD memory device 135-1. In some situations, the block may be pre-identified (e.g., based on a frequency of program/erase cycles for the block). In some situations, the block may be randomly selected. Controller 130 may perform the read operations using default threshold voltages (e.g., default read levels that may be used as a first guess which was provided by first SSD memory device 135-1). In some situations, because of read disturb, first SSD memory device 135-1 may have experienced gain of electrons in the erased cells (e.g., gain of electrons may have occurred on the block for cells in an erase state). Accordingly, performing the read operations using the default threshold voltages may result in read errors. In some situations, the default threshold voltages may include the pre-determined threshold voltages discussed herein.

As shown in FIG. 1E and by reference number 165, controller 130 may provide information regarding the read errors as inputs to machine learning model 115. For example, controller 130 may provide (to machine learning model 115) information identifying bit error rates corresponding to the pre-determined threshold voltages. In some examples, controller 130 may provide, as part of the inputs, information regarding a number of program/erase cycles regarding the block and information regarding wordlines of the block. The information may be obtained from a non-volatile memory associated with controller 130. In some examples, the information regarding the wordlines may include threshold voltages associated with the wordlines, information regarding error rates (e.g., bit error rates) associated with the wordlines, information regarding a frequency of access and pattern of access of the wordlines, among other examples.

In some instances, controller 130 may analyze the information regarding the number of program/erase cycles to determine the number of program/erase cycles regarding the block. Controller 130 may select a machine learning model based on the number of program/erase cycles. For example, controller 130 may select a machine learning model that has been trained with the characterization data of one or more training memory devices 120 that have experienced the number of program/erase cycles.

Figure 1F:
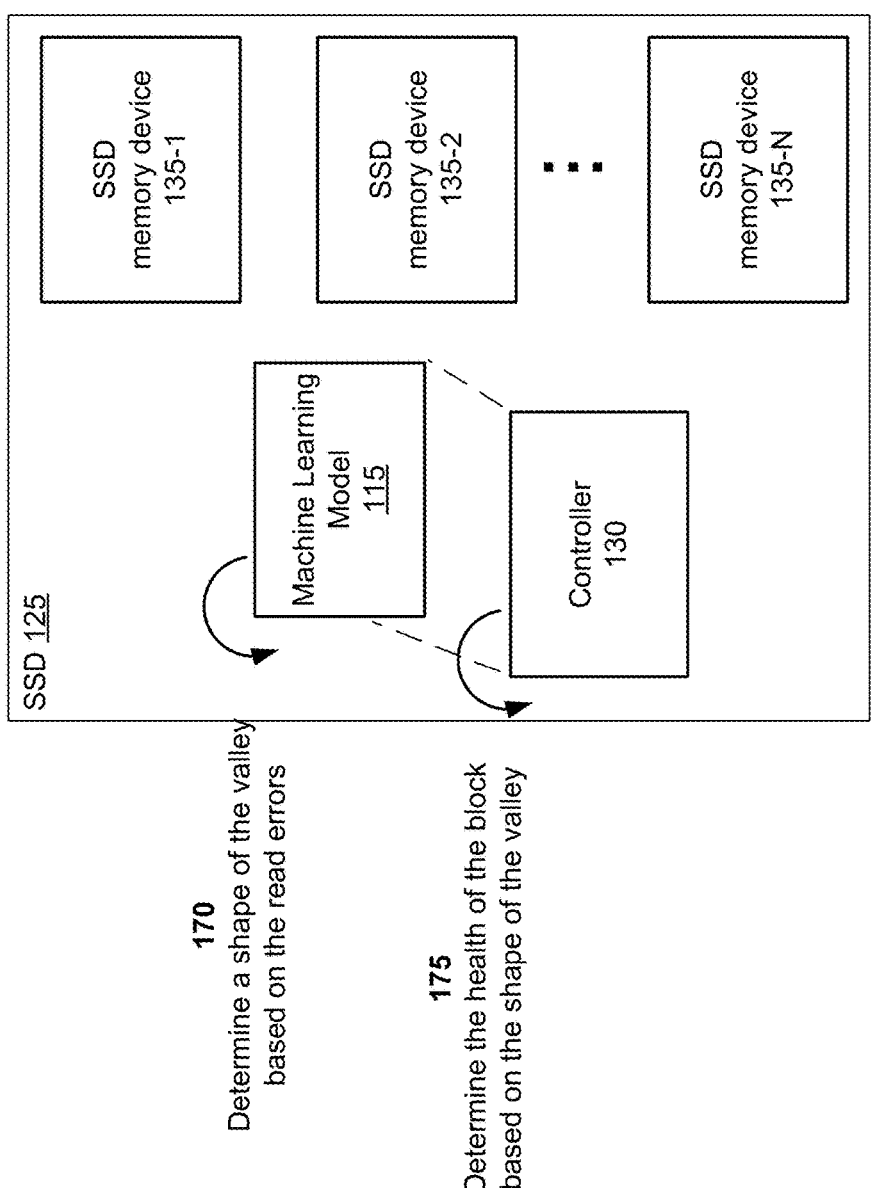

As shown in FIG. 1F, and by reference number 170, controller 130 may determine a shape of the valley based on the inputs. In some implementations, machine learning model 115 may use bit error rates corresponding to the default threshold voltages (provided as inputs) to determine a valley of the overlapped charge states after first SSD memory device 135-1 has been subjected to one or more read disturb conditions. For example, machine learning model 115 may determine a shape of the valley (e.g., valley-0) of the overlapped charge states. In some situation, machine learning model 115 may determine a distribution of threshold voltages based on the inputs and determine the shape of the valley based on the distribution of threshold voltages. Different distributions of threshold voltages may identify different read disturb conditions. The overlapped charge states may include charge states with lowest threshold voltages.

Machine learning model 115 may recognize the shape of the valley as pattern of threshold voltages (or signature of threshold voltages) of a non-volatile memory device that has been subjected to a particular data retention condition. Machine learning model 115 may use the inputs to determine a change in the threshold voltages for the shape of the valley of the overlapped charge states.

As shown in FIG. 1F, and by reference number 175, controller 130 may determine a health of the block. For example, controller 130 may determine the health of the block based on the shape of the valley. As explained herein, different shapes of the valley may indicate different levels of read disturb. In this regard, controller 130 may determine a level of read disturb experienced by the wordline of the block based on the shape of the valley and, accordingly, determine the health of the block based on the level of read disturb experienced by the wordline. In some implementations, machine learning model 115 may provide information regarding the health of the block. In some implementations, machine learning model 115 may provide information regarding the health of the block, without making an interim determination of the shape of the valley.

Figure 1G:
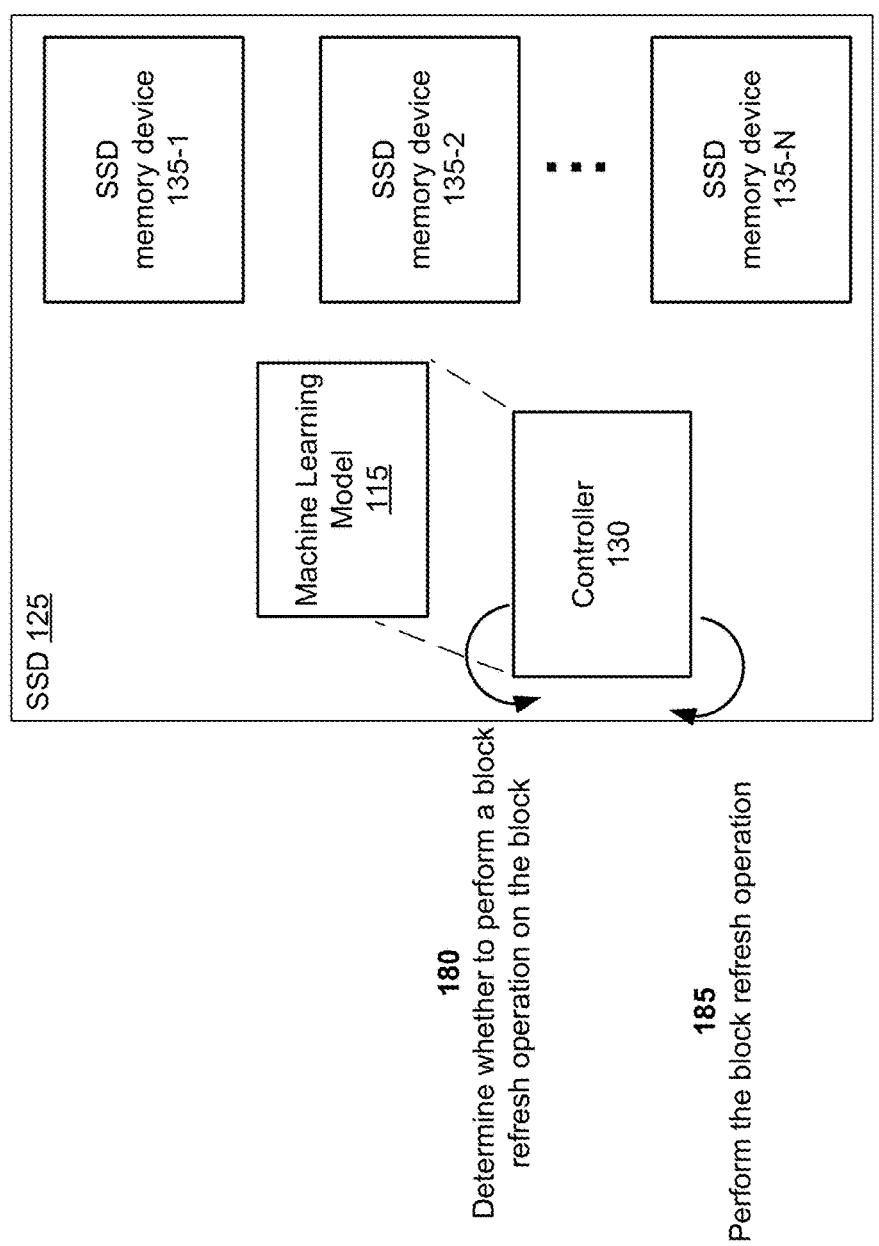

As shown in FIG. 1G, and by reference number 180, controller 130 may determine whether to perform a block refresh operation. For example, controller 130 may determine whether to perform the block refresh operation based on the health of the block. In some implementations, controller 130 may determine whether the health of the block satisfies a health threshold. If controller 130 determines that the health of the block satisfies the health threshold, controller 130 may determine that the block refresh operation is not to be performed. Alternatively, if controller 130 determines that the health of the block does not satisfy the health threshold, controller 130 may determine that the block refresh operation is to be performed.

As shown in FIG. 1G, and by reference number 185, controller 130 may perform the block refresh operation. For example, controller 130 may determine that the health of the block does not satisfy the health threshold and, accordingly, determine that the block refresh operation is to be performed. In other words, the shape of the valley may indicate that the wordline has been subjected to a level of read disturb that may cause the wordline (and additional one or more wordlines) to be subject to data corruption or data loss.

In some implementations, controller 130 may determine a frequency for performing the block refresh operation for the block based on the distribution of threshold voltages (e.g., based on the level of read disturb). For example, a first frequency associated with a first level of read disturb may exceed a second frequency associated with a second level of read disturb if the first level exceeds the second level.

In some implementations, controller 130 may add information regarding the block to a queue for performing block refresh operations. The queue may include a data structure that stores information regarding one or more blocks that have been identified for block refresh operations. In some examples, controller 130 may cause the block refresh operations to be performed on the one or more blocks on a first in first out scheme.

In some implementations, controller 130 may perform a block refresh operation on one or more particular blocks that include one or more particular wordlines after a power-on condition following a power off-condition on SSD 125. As a result of the power-off condition, the number of program/erase cycles for the one or more particular blocks or the one or more particular wordlines may be erased. In some situations, the one or more particular wordlines may be wordlines that typically are most impacted by read disturb conditions. In some examples, over a course of operation of first SSD memory device 135-1, controller 130 may maintain information regarding wordlines that typically are most impacted by read disturb conditions. In this regard, after the power-on condition following the power-off condition, controller 130 may perform read operations on the one or more particular wordlines and provide inputs to machine learning model 115 after performing the read operations, as described herein. Based on the inputs, machine learning model 115 may determine a health of the one or more particular blocks. As part of an output from machine learning model 115 based on the inputs, machine learning model 115 may provide information regarding the health of the one or more particular blocks. Controller 130 may cause block refresh operations to be performed on the one or more particular blocks based on the health of the one or more particular blocks. Alternatively, as part of the output from machine learning model 115 based on the inputs, machine learning model 115 may provide information indicating that the block refresh operations are to be performed on the one or more particular blocks. Controller 130 may cause the block refresh operations to be performed on the one or more particular blocks based on the information indicating that the block refresh operations are to be performed.

As indicated above, FIGS. 1A-1G are provided as an example. Other examples may differ from what is described with regard to FIGS. 1A-1G. The number and arrangement of devices shown in FIGS. 1A-1G are provided as an example. In practice, there may be additional devices, fewer devices, different devices, or differently arranged devices than those shown in FIGS. 1A-1G. Furthermore, two or more devices shown in FIGS. 1A-1G may be implemented within a single device, or a single device shown in FIGS. 1A-1G may be implemented as multiple, distributed devices. Additionally, or alternatively, a set of devices (e.g., one or more devices) shown in FIGS. 1A-1G may perform one or more functions described as being performed by another set of devices shown in FIGS. 1A-1G.

Figure 2:
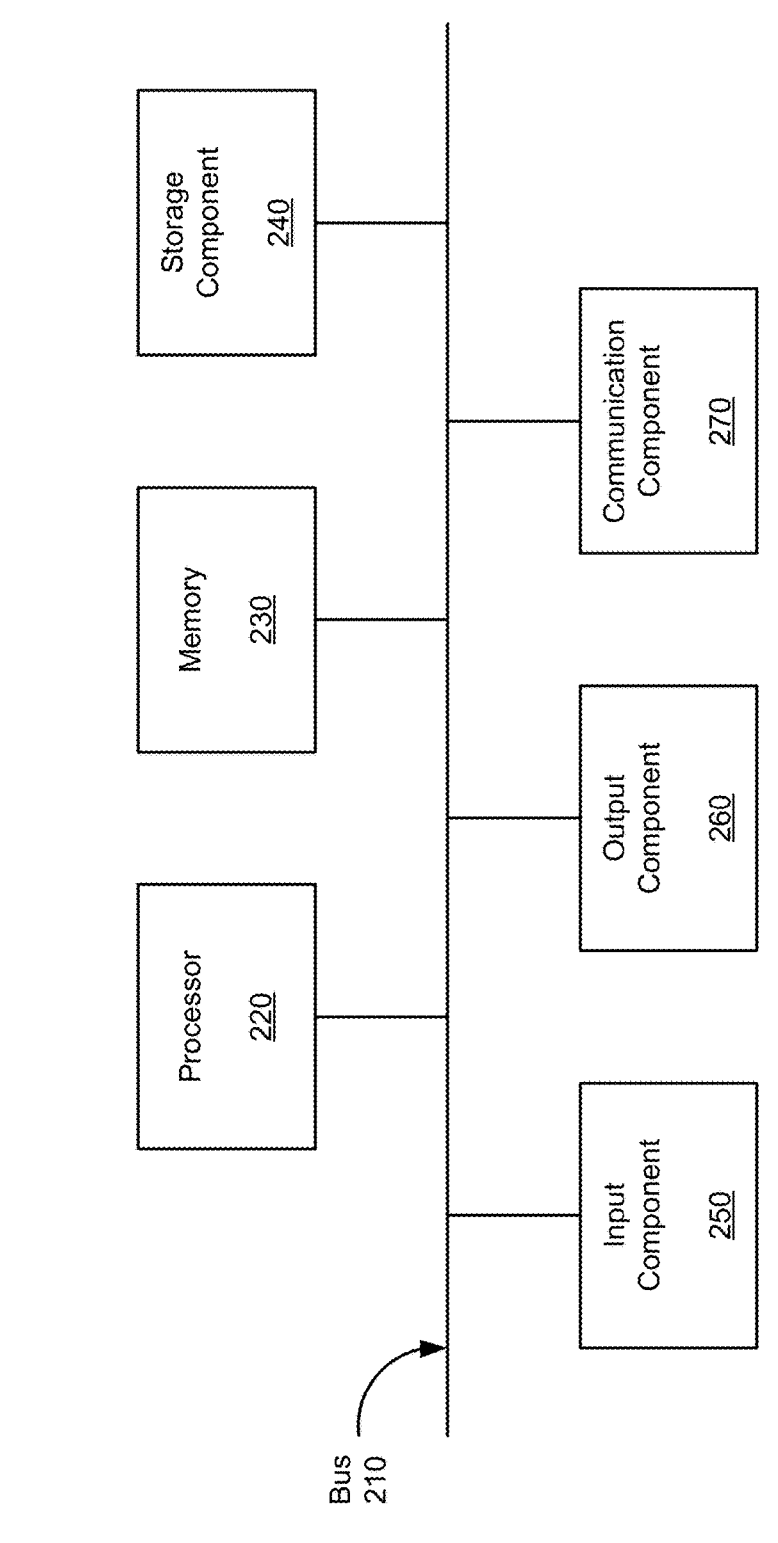
FIG. 2 is a diagram of example components of one or more devices of FIGS. 1A-1G.

FIG. 2 is a diagram of example components of a device 200, which may correspond to one or more devices of FIG. 1, such as model training platform 110. In some implementations, model training platform 110 may include one or more devices 200 and one or more components of device 200. As shown in FIG. 6, device 200 may include a bus 210, a processor 220, a memory 230, a storage component 240, an input component 250, an output component 260, and a communication component 270.

Bus 210 includes a component that enables wired or wireless communication among the components of device 200. Processor 220 may be a central processing unit, a graphics processing unit, a microprocessor, a controller, a microcontroller, a digital signal processor, a field-programmable gate array, an application-specific integrated circuit, or another type of processing component. Processor 220 is implemented in hardware, firmware, or a combination of hardware and software. In some implementations, processor 220 includes one or more processors capable of being programmed to perform a function. Memory 230 includes a random access memory, a read only memory, or another type of memory (e.g., a flash memory, a magnetic memory, or an optical memory).

Storage component 240 stores information or software related to the operation of device 200. For example, storage component 240 may include a hard disk drive, a magnetic disk drive, an optical disk drive, a solid state disk drive, a compact disc, a digital versatile disc, or another type of non-transitory computer-readable medium. Input component 250 enables device 200 to receive input, such as user input or sensed inputs. For example, input component 250 may include a touch screen, a keyboard, a keypad, a mouse, a button, a microphone, a switch, a sensor, a global positioning system component, an accelerometer, a gyroscope, or an actuator. Output component 260 enables device 200 to provide output, such as via a display, a speaker, or one or more light-emitting diodes. Communication component 270 enables device 200 to communicate with other devices, such as via a wired connection or a wireless connection. For example, communication component 270 may include a receiver, a transmitter, a transceiver, a modem, a network interface card, or an antenna.

Device 200 may perform one or more processes described herein. For example, a non-transitory computer-readable medium (e.g., memory 230 or storage component 240) may store a set of instructions (e.g., one or more instructions, code, software code, or program code) for execution by processor 220. Processor 220 may execute the set of instructions to perform one or more processes described herein. In some implementations, execution of the set of instructions, by one or more processors 220, causes the one or more processors 220 or the device 200 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 2 are provided as an example. Device 200 may include additional components, fewer components, different components, or differently arranged components than those shown in FIG. 2. Additionally, or alternatively, a set of components (e.g., one or more components) of device 200 may perform one or more functions described as being performed by another set of components of device 200.

FIGS. 3A-3C are flowcharts of an example process 300 associated with determining a health of a block using a machine learning model. In some implementations, one or more process blocks of FIGS. 3A-3C may be performed by a controller (e.g., controller 130). In some implementations, one or more process blocks of FIGS. 3A-3C may be performed by another device or a group of devices separate from or including the controller, such as a model training platform (e.g., model training platform 110) and/or an SSD (e.g., SSD 125). Additionally, or alternatively, one or more process blocks of FIGS. 3A-3C may be performed by one or more components of device 200, such as processor 220, memory 230, storage component 240, input component 250, output component 260, or communication component 270.

As shown in FIG. 3A, process 300 may include performing, on one or more wordlines of a block of a non-volatile memory device, read operations using default threshold voltages associated with two overlapped charge states (block 310). For example, the controller may perform, on one or more wordlines of a block of a non-volatile memory device, read operations using default threshold voltages associated with two overlapped charge states, as described above.

As further shown in FIG. 3A, process 300 may include determining, using a machine learning model, a distribution of threshold voltages for the two overlapped charge states based on read errors associated with the threshold voltages (block 320). For example, the machine learning model, may determine a distribution of threshold voltages for the two overlapped charge states and, based on the distribution of threshold voltage, output information to the controller as threshold voltages to use in order to reduce read errors associated with the threshold voltages, as described above.

In some implementations, the distribution of threshold voltages identify one of different types of read disturb conditions (block 320-1) that include a first read disturb condition associated with performing multiple read operations on a single wordline of a page of the non-volatile memory device (block 320-2), a second read disturb condition associated with performing multiple read operations on multiple wordlines of a single page of the non-volatile memory device (block 320-3), and a third read disturb condition associated with performing multiple read operations with different amounts of delays between the multiple read operations (block 320-4), wherein the multiple read operations are performed at different temperatures (block 310-5). The multiple read operations may be performed at different temperatures because the effect of read disturb changes as a temperature of the non-volatile memory device changes (e.g., as a temperature of a die changes). Accordingly, by performing the multiple read operations at different temperatures, implementations described herein may train different machine learning models to determine the effects of read disturb for non-volatile memory devices operating at different temperatures.

As further shown in FIG. 3A, process 300 may include determining, based on the determined distribution of threshold voltages, a health of the block (block 330). For example, the controller may determine, based on the determined distribution of threshold voltages, a health of the block, as described above.

As further shown in FIG. 3A, process 300 may include performing a block refresh operation for the block based on the health of the block (block 340). For example, the controller may perform a block refresh operation for the block based on the health of the block. In some implementations, the block refresh operation is performed when the health satisfies a health threshold. In some implementations, the block refresh operation is not performed when the health does not satisfy the health threshold.

In some implementations, the two overlapped charge states are charge states with lowest threshold voltages out of threshold voltages of multiple of charge states. In some implementations, the machine learning model is included in a plurality of machine learning models associated with different program/erase cycles. In this regard, process 300 may include, as shown in FIG. 3B, determining a number of program/erase cycles of the block (block 345), and selecting the machine learning model to determine the distribution of threshold voltages based on the number of program/erase cycles of the block (block 350).

In some implementations, process 300 includes determining a frequency for performing the block refresh operation for the block based on the distribution of threshold voltages (block 355).

In some implementations, process 300 includes determining that the block refresh operation is to be performed for the block based on the distribution of threshold voltages (block 360), and adding information regarding the block to a queue for performing block refresh operations (block 365). The queue includes information regarding one or more blocks that have been identified for block refresh operations.

In some implementations, process 300, as shown in FIG. 3C, includes identifying the one or more wordlines, using the characterization data, as one or more wordlines that are most impacted by read disturb conditions (block 370).

In some implementations, process 300 includes determining, based on an output of the machine learning model, health of an additional block of the non-volatile memory device after a power-off condition (block 375), and performing a block refresh operation for the additional block based on the health of the additional block (block 380).

In some implementations, process 300 includes determining a health of the block based on the distribution of threshold voltages (block 385), determining whether the health satisfies a health threshold (block 390), and performing the block refresh operation when the health satisfies the health threshold (block 395); and not performing the block refresh operation when the health does not satisfy the health threshold (block 396). The distribution of threshold voltages may be an error profiling at different threshold voltages. For example, the distribution of threshold voltages may be an error distribution with respect to threshold voltages. The distribution of threshold voltages may indicate a valley formed by curves representing the distribution of threshold voltages of the overlapped charge states, as described herein. As an example, the health of the block may be determined based on a shape of the valley. In other words, the health of the block may be determined based on a shape of the valley, as described herein.

Although FIGS. 3A-3C show example blocks of process 300, in some implementations, process 300 may include additional blocks, fewer blocks, different blocks, or differently arranged blocks than those depicted in FIGS. 3A-3C. Additionally, or alternatively, two or more of the blocks of process 300 may be performed in parallel.

Figure 4:
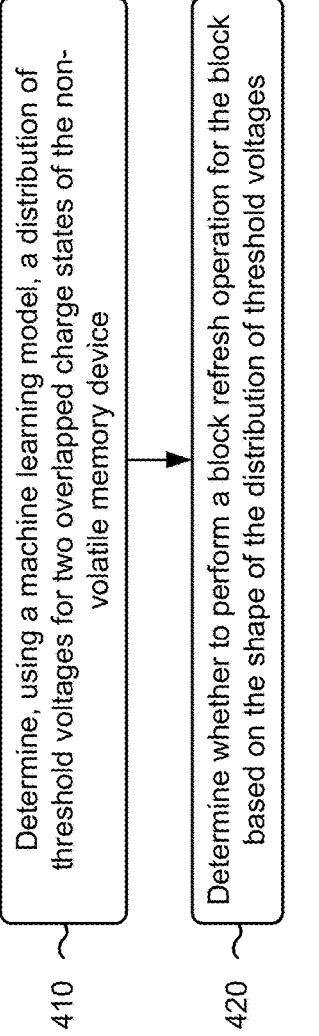
FIG. 4 is a flowchart of an example process associated with determining a health of a block using a machine learning model.

FIG. 4 is a flowchart of an example process 400 associated with determining a health of a block using a machine learning model. In some implementations, one or more process blocks of FIG. 4 may be performed by a controller (e.g., controller 130). In some implementations, one or more process blocks of FIG. 4 may be performed by another device or a group of devices separate from or including the controller, such as a model training platform (e.g., model training platform 110) and/or an SSD (e.g., SSD 125). Additionally, or alternatively, one or more process blocks of FIG. 4 may be performed by one or more components of device 200, such as processor 220, memory 230, storage component 240, input component 250, output component 260, or communication component 270.

As shown in FIG. 4, process 400 may include determining, using a machine learning model, a distribution of threshold voltages for two overlapped charge states of the non-volatile memory device (block 410). For example, the system may determine, using a machine learning model, a distribution of threshold voltages for two overlapped charge states of the non-volatile memory device. The distribution of threshold voltages may be an error distribution with respect to different threshold voltages. In some implementations, the distribution of threshold voltages is determined based on read operations performed on one or more wordlines of a block of the non-volatile memory device. The distribution of threshold voltages may indicate a valley formed by curves representing the distribution of threshold voltages of the overlapped charge states, as described herein. As an example, the health of the block may be determined based on a shape of the distribution of threshold voltages. In other words, the health of the block may be determined based on a shape of the valley, as described herein.

As further shown in FIG. 4, process 400 may include determining whether to perform a block refresh operation for the block based on the shape of the distribution of threshold voltages (block 420). For example, the system may determine whether to perform a block refresh operation for the block based on the shape of the distribution of threshold voltages, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIG. 5 is a flowchart of an example process 500 associated with determining a health of a block using a machine learning model. In some implementations, one or more process blocks of FIG. 5 may be performed by a controller (e.g., controller 130). In some implementations, one or more process blocks of FIG. 5 may be performed by another device or a group of devices separate from or including the controller, such as a model training platform (e.g., model training platform 110) and/or an SSD (e.g., SSD 125). Additionally, or alternatively, one or more process blocks of FIG. 3 may be performed by one or more components of device 200, such as processor 220, memory 230, storage component 240, input component 250, output component 260, or communication component 270.

As shown in FIG. 5, process 500 may include determining, using a machine learning model, a distribution of threshold voltages for two overlapped charge states of a non-volatile memory device (block 510). For example, the controller may determine, using a machine learning model, a distribution of threshold voltages for two overlapped charge states of a non-volatile memory device. In some implementations, the distribution of threshold voltages is determined based on threshold voltages determined based on read operations performed on one or more wordlines of a block of the non-volatile memory device.

As further shown in FIG. 5, process 500 may include determining a health of the block based on the distribution of threshold voltages (block 520). For example, the controller may determine a health of the block based on the distribution of threshold voltages, as described above.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

As used herein, the term "component" is intended to be broadly construed as hardware, firmware, or a combination of hardware and software. It will be apparent that systems or methods described herein may be implemented in different forms of hardware, firmware, or a combination of hardware and software. The actual specialized control hardware or software code used to implement these systems or methods is not limiting of the implementations. Thus, the operation and behavior of the systems or methods are described herein without reference to specific software code-it being understood that software and hardware can be used to implement the systems or methods based on the description herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, the term "component" is intended to be broadly construed as hardware, firmware, or a combination of hardware and software. It will be apparent that systems or methods described herein may be implemented in different forms of hardware, firmware, or a combination of hardware and software. The actual specialized control hardware or software code used to implement these systems or methods is not limiting of the implementations. Thus, the operation and behavior of the systems or methods are described herein without reference to specific software code-it being understood that software and hardware can be used to implement the systems or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Although particular combinations of features are recited in the claims or disclosed in the specification, these combinations are not intended to limit the disclosure of various implementations. In fact, many of these features may be combined in ways not specifically recited in the claims or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "or," unless explicitly stated otherwise (e.g., if used in combination with "either" or "only one of").

23

24

What is claimed is:

1. A method comprising:

performing, on one or more wordlines of a block of a non-volatile memory device, read operations using default threshold voltages associated with two overlapped charge states;

determining, using a machine learning model, a distribution of threshold voltages for the two overlapped charge states based on read errors associated with the threshold voltages, wherein the machine learning model is selected based on a number of program/erase cycles of the block;

determining, based on the determined distribution of threshold voltages, a health of the block; and performing a block refresh operation for the block based on the health of the block, wherein the block refresh operation is not performed when the health satisfies a health threshold, and wherein the block refresh operation is performed when the health does not satisfy the health threshold.

2. The method of claim 1, wherein the two overlapped charge states are charge states with lowest threshold voltages out of threshold voltages of multiple of charge states.

3. The method of claim 1, wherein the machine learning model is included in a plurality of machine learning models associated with different program/erase cycles, wherein the method comprises:

determining the number of program/erase cycles of the block; and selecting the machine learning model to determine the distribution of threshold voltages based on the number of program/erase cycles of the block.

4. The method of claim 1, comprising:

determine a frequency for performing the block refresh operation for the block based on the distribution of threshold voltages.

5. The method of claim 1, wherein the distribution of threshold voltages identify one of different read disturb conditions that include:

a first read disturb condition associated with performing multiple read operations on a single wordline of a page of the non-volatile memory device, a second read disturb condition associated with performing multiple read operations on multiple wordlines of a single page of the non-volatile memory device, and a third read disturb condition associated with performing multiple read operations with different amounts of delays between the multiple read operations, wherein the multiple read operations are performed at different temperatures.

6. The method of claim 1, comprising:

determining that the block refresh operation is to be performed for the block based on the health of the block; and adding information regarding the block to a queue for performing block refresh operations, wherein the queue includes information regarding one or more blocks that have been identified for block refresh operations.

7. The method of claim 1, comprising:

identifying the one or more wordlines, using characterization data, as one or more wordlines that are most impacted by read disturb conditions.

8. The method of claim 1, comprising:

determining, based on an output of the machine learning model, health of an additional block of the non-volatile memory device after a power-off condition; and performing a block refresh operation for the additional block based on the health of the additional block.

9. A system comprising:

a controller, of a non-volatile memory device, to:

determine, using a machine learning model, a distribution of threshold voltages for two overlapped charge states of the non-volatile memory device, wherein the distribution of threshold voltages is determined based on read operations performed on one or more wordlines of a block of the non-volatile memory device, and wherein the machine learning model is selected based on a number of program/erase cycles of the block; and determine whether to perform a block refresh operation for the block based on the distribution of threshold voltages.

10. The system of claim 9, wherein the machine learning model is trained to determine, after a power-on condition following a power-off conditions, health of multiple blocks of the non-volatile memory devices.

11. The system of claim 9, wherein the controller is to:

determine a frequency for performing the block refresh operation for the block based on the distribution of threshold voltages.

12. The system of claim 9, wherein the controller is to:

determine that the block refresh operation is to be performed for the block based on the distribution of threshold voltages; and add information regarding the block to a queue for performing block refresh operations, wherein the queue includes information regarding multiple blocks that have been identified for block refresh operations.

13. The system of claim 9, wherein the controller is to:

select a machine learning model, from a plurality of machine learning models, based on a number of program/erase cycles of the one or more blocks.

14. The system of claim 9, wherein the controller is to:

determine a health of the block based on the distribution of threshold voltages; and perform a block refresh operation for the block based on the health of the block.

15. The system of claim 14, wherein, to determine whether to perform the block refresh operation, the controller is to:

determine whether the health satisfies a health threshold;

perform the block refresh operation when the health satisfies the health threshold; and not perform the block refresh operation when the health does not satisfy the health threshold.

16. A computer program product comprising:

one or more computer readable storage media, and program instructions collectively stored on the one or more computer readable storage media, the program instructions comprising:

program instructions to determine, using a machine learning model, a distribution of threshold voltages for two overlapped charge states of a non-volatile memory device, wherein the distribution of threshold voltages is determined based on threshold voltages determined based on read operations performed on one or more wordlines of a block of the non-volatile memory device, and wherein the machine learning model is trained to determine, after a power-on condition following a power-off conditions, health of blocks of non-volatile memory devices; and program instructions to determine a health of the block based on the distribution of threshold voltages.

17. The computer program product of claim 16, wherein the program instructions comprise:

program instructions to perform an operation on the block based on the health of the block.

18. The computer program product of claim 17, wherein the program instructions to perform the operation comprise:

program instructions to perform a block refresh operation on the block based on the health of the block.

19. The computer program product of claim 18, wherein the program instructions to perform the operation comprise:

program instructions to determine that the health of the block does not satisfy a health threshold; and program instructions to determine that the block refresh operation is to be performed based on determining that the health of the block does not satisfy the health threshold.

20. The computer program product of claim 18, wherein the program instructions comprise:

program instructions to determine a frequency for performing the block refresh operation for the block based on the distribution of threshold voltages.

\* \* \* \* \*